(12) United States Patent
Kashima

(10) Patent No.: US 12,052,872 B2
(45) Date of Patent: Jul. 30, 2024

(54) SEMICONDUCTOR MEMORY DEVICE HAVING STACK OF POLYCRYSTALLINE SEMICONDUCTOR LAYERS WITH DIVERSE AVERAGE CRYSTAL GRAIN SIZES

(71) Applicant: Kioxia Corporation, Tokyo (JP)

(72) Inventor: Takayuki Kashima, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 364 days.

(21) Appl. No.: 17/346,344

(22) Filed: Jun. 14, 2021

(65) Prior Publication Data
US 2022/0285371 A1 Sep. 8, 2022

(30) Foreign Application Priority Data
Mar. 8, 2021 (JP) ................................. 2021-036203

(51) Int. Cl.
*H10B 43/35* (2023.01)
*H10B 41/27* (2023.01)
(Continued)

(52) U.S. Cl.
CPC ............. *H10B 43/35* (2023.02); *H10B 41/27* (2023.02); *H10B 41/35* (2023.02); *H10B 43/27* (2023.02)

(58) Field of Classification Search
CPC ........ H10B 43/35; H10B 41/27; H10B 41/35; H10B 43/27; H10B 43/40
See application file for complete search history.

(56) References Cited

U.S. PATENT DOCUMENTS 10,438,966 B2   10/2019   Shioda et al.
10,658,295 B2    5/2020   Kawai et al.
(Continued)

FOREIGN PATENT DOCUMENTS

TW        202016995 A     5/2020

OTHER PUBLICATIONS

Miltiadis K. Hatalis, David W. Greve; "Large grain polycrystalline silicon by low-temperature annealing of low-pressure chemical vapor deposited amorphous silicon films." Journal of Applied Physics Apr. 1, 1988; 63 (7): 2260-2266. (Year: 1988).*

(Continued)

*Primary Examiner* — Benjamin P Sandvik
*Assistant Examiner* — John Patrick Cornely
(74) *Attorney, Agent, or Firm* — Holtz, Holtz & Volek PC

(57) ABSTRACT

A semiconductor memory device includes: a first stack including a first polycrystalline semiconductor layer having a first average crystal grain size, a second polycrystalline semiconductor layer having a second average crystal grain size smaller than the first average crystal grain size, an intermediate layer between the first and second polycrystalline semiconductor layers, and a third polycrystalline semiconductor layer provided on the second polycrystalline semiconductor layer and having a third average crystal grain size smaller than the first average crystal grain size; a second stack provided above the first stack and having conductive layers and insulation layers, each conductive layer and each insulation layer being alternately stacked and extending in a first direction; a semiconductor layer through the second stack, and on the third polycrystalline semiconductor layer; and a memory layer through the second stack, and between the semiconductor layer and the conductive layer in the first direction.

4 Claims, 12 Drawing Sheets

(51) Int. Cl.
*H10B 41/35* (2023.01)
*H10B 43/27* (2023.01)

(56) References Cited

U.S. PATENT DOCUMENTS

2020/0075619 A1   3/2020   Hazue
2020/0127081 A1   4/2020   Ishida et al.
2020/0185402 A1   6/2020   Son et al.

OTHER PUBLICATIONS

Oxford English Dictionary, s.v. "compound (adj.)," Dec. 2023, https://doi.org/10.1093/OED/3228129424. (Year: 2023).*

* cited by examiner

SEMICONDUCTOR MEMORY DEVICE HAVING STACK OF POLYCRYSTALLINE SEMICONDUCTOR LAYERS WITH DIVERSE AVERAGE CRYSTAL GRAIN SIZES

CROSS-REFERENCE TO RELATED APPLICATION

This application is based upon and claims the benefit of priority from Japanese Patent Application No. 2021-036203, filed on Mar. 8, 2021; the entire contents of which are incorporated herein by reference.

FIELD

Embodiments relate to a semiconductor memory device and a method of manufacturing the semiconductor memory device.

BACKGROUND

In recent years, known examples of a semiconductor memory device include a peripheral circuit below a memory cell array.

DETAILED DESCRIPTION

Figure 1:
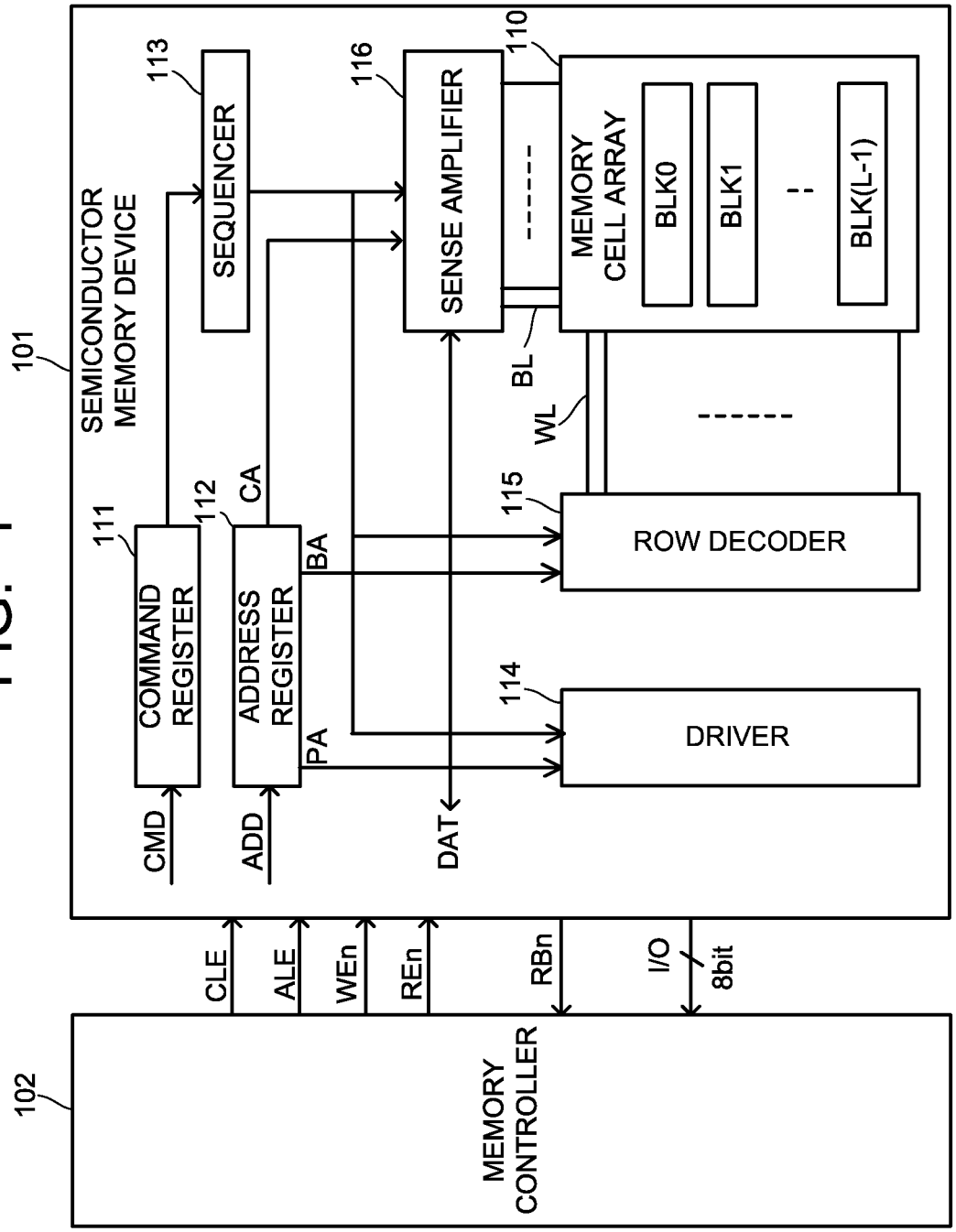
FIG. 1 is a block diagram illustrating a configuration example of a memory system.

A semiconductor memory device of an embodiment includes: a first stack including a first polycrystalline semiconductor layer having a first average crystal grain size, a second polycrystalline semiconductor layer having a second average crystal grain size smaller than the first average crystal grain size, an intermediate layer provided between the first and second polycrystalline semiconductor layers, and a third polycrystalline semiconductor layer provided on the second polycrystalline semiconductor layer and having a third average crystal grain size smaller than the first average crystal grain size; a second stack provided above the first stack and having conductive layers and insulation layers, each conductive layer and each insulation layer being alternately stacked and extending in a first direction; a semiconductor layer provided through the second stack in a second direction intersecting the first direction, and provided on the third polycrystalline semiconductor layer; and a memory layer provided through the second stack in the second direction, and provided between the semiconductor layer and the conductive layer in the first direction.

Embodiments will be hereinafter described with reference to the drawings. In the drawings, the relation of thickness and planer dimension of each constituent element, a thickness ratio among the constituent elements, and so on may be different from actual ones. Further, in the embodiments, substantially the same constituent elements are denoted by the same reference signs, and a description thereof will be appropriately omitted.

FIG. 1 is a block diagram illustrating a configuration example of a memory system. The memory system includes a semiconductor memory device 101, and a memory controller 102.

The semiconductor memory device 101 includes a memory cell array 110, a command register 111, an address register 112, a sequencer 113, a driver 114, a row decoder 115, and a sense amplifier 116.

The memory cell array 110 includes plural blocks BLK (BLK0 to BLK(L−1)), where L is a natural number of 2 or more. The blocks BLK are each a set of memory transistors MT whose data storage is nonvolatile.

The memory cell array 110 is connected to the sense amplifier 116 via bit lines BL. As will be described later, the memory cell array 110 includes word lines WL, and is connected to the row decoder 115 via the word lines WL. Each memory transistor MT (each memory cell) is connected to one of the word lines WL and one of the bit lines BL.

The command register 111 stores a command signal CMD received from the memory controller 102. The command signal CMD includes, for example, command data causing the sequencer 113 to execute a read operation, a write operation, and an erase operation.

The address register 112 stores an address signal ADD received from the memory controller 102. The address signal ADD includes, for example, a block address BA, a page address PA, and a column address CA. For example, the block address BA, the page address PA, and the column address CA are used for selecting the block BLK, the word line WL, and the bit line BL, respectively.

The sequencer 113 controls the operation of the semiconductor memory device 101. For example, the sequencer 113 controls the driver 114, the row decoder 115, the sense amplifier 116, and so on in accordance with the command signal CMD held in the command register 111 to execute the operation such as the read operation, the write operation, and the erase operation.

The driver 114 generates a voltage used for operations such as the read operation, the write operation, and the erase operation. Further, the driver 114 applies the generated voltage to a signal line corresponding to the word line WL selected in accordance with the page address PA held in the address register 112, for example.

In accordance with the block address BA held in the address register 112, the row decoder 115 selects one corresponding block BLK in the memory cell array 110. Subsequently, for example, the row decoder 115 transfers the voltage applied to the signal line corresponding to the selected word line WL to the selected word line WL in the selected block BLK.

In the write operation, the sense amplifier 116 applies a desired voltage to each bit line BL according to write data DAT received from the memory controller 102. Further, in the read operation, the sense amplifier 116 determines data stored in the memory cell in accordance with the voltage of the bit line BL and transfers the determination result as read data DAT to the memory controller 102.

The communication between the semiconductor memory device 101 and the memory controller 102 supports the NAND interface protocol, for instance. For example, in the communication between the semiconductor memory device 101 and the memory controller 102, a command latch enable signal CLE, an address latch enable signal ALE, a write enable signal WEn, a read enable signal REn, a ready/busy signal RBn, and an input/output signal I/O are used.

The command latch enable signal CLE indicates that an input/output signal I/O received by the semiconductor memory device 101 is a command signal CMD. The address latch enable signal ALE indicates that a received signal I/O is an address signal ADD. The write enable signal WEn is a signal that commands the semiconductor memory device 101 to receive an input/output signal I/O. The read enable signal REn is a signal that commands the semiconductor memory device 101 to output an input/output signal I/O.

The ready/busy signal RBn is a signal that notifies the memory controller 102 whether the semiconductor memory device 101 is in a ready state in which it accepts a command from the memory controller 102 or is in a busy state in which it does not accept a command.

The input/output signal I/O is a signal with, for example, an eight-bit width, and can include signals such as the command signal CMD, the address signal ADD, and the write data signal DAT.

A combination of the semiconductor memory device 101 and the memory controller 102 described above may form one memory system. Examples of such a memory system include a memory card and a solid state drive (SSD).

Figure 2:
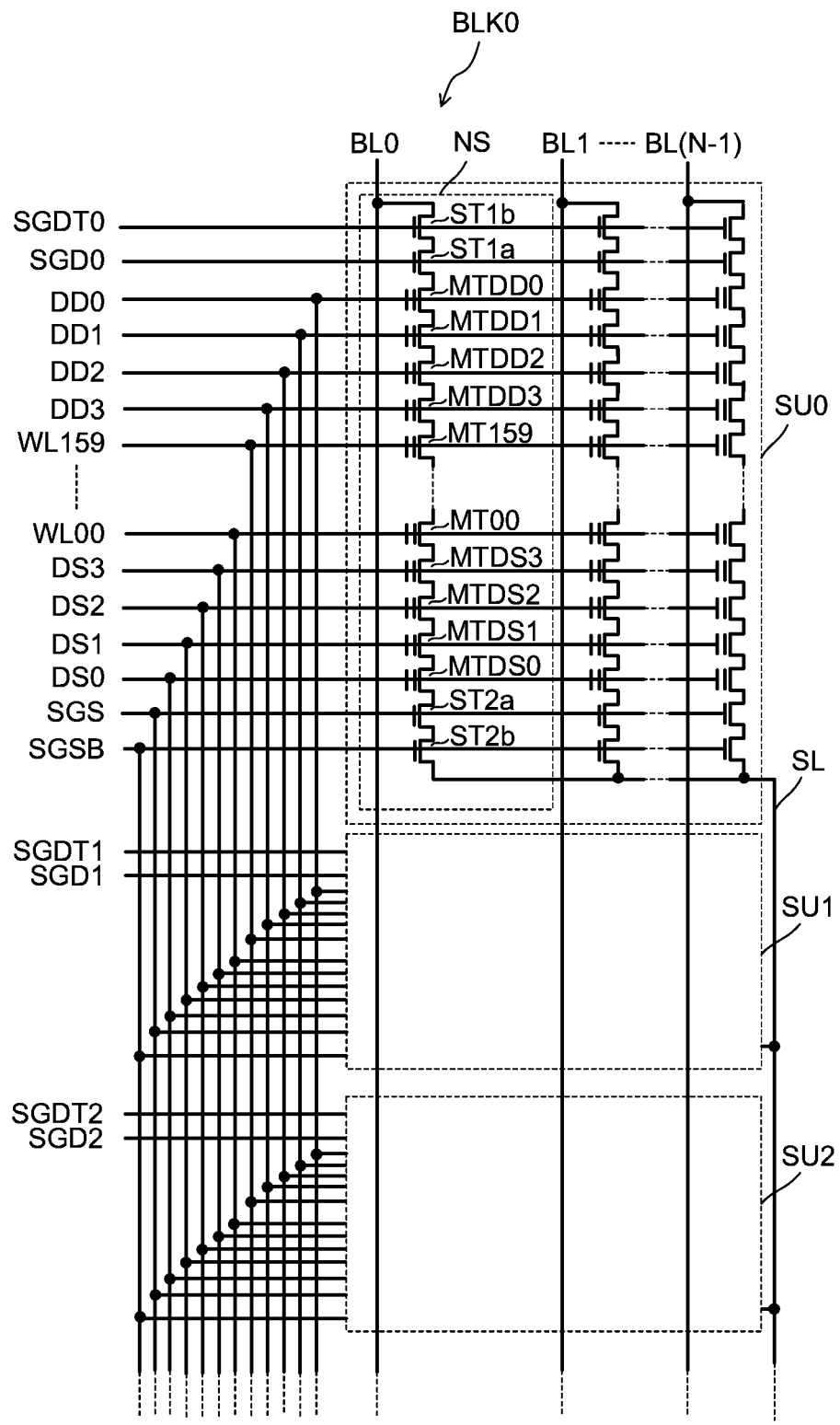
FIG. 2 is a circuit diagram illustrating a circuit configuration of a memory cell array 110.

Next, an example of a circuit configuration of the memory cell array 110 will be described. FIG. 2 is a circuit diagram illustrating the circuit configuration of the memory cell array 110. FIG. 2 illustrates the block BLK0 as an example, and the configuration of the rest of the blocks BLK is also the same.

The block BLK includes plural string units SU. The string units SU each include plural NAND strings NS. FIG. 2 illustrates the three string units SU (SU0 to SU2), but the number of the string units SU is not limited in particular.

The NAND strings NS are each connected to one of bit lines BL (BL0 to BL(N−1)), where N is a natural number of 2 or more. The NAND strings NS each can include plural the memory transistors MT, at least one of dummy memory transistors MTDD, at least one of dummy memory transistors MTDS, at least one of select transistors ST1, and at least one of select transistors ST2.

The memory transistor MT includes a control gate and a charge storage layer, and stores data in a nonvolatile manner FIG. 2 illustrates the memory transistors MT (MT00 to MT159), but the number of the memory transistors MT is not limited in particular.

Each dummy memory transistor MTDD and each dummy memory transistor MTDS includes a control gate and a charge storage layer. Each dummy memory transistor MTDD and each dummy memory transistor MTDS has the same structure as the structure of the memory transistor MT, but it is not used for storing valid data.

The memory transistors MT, the dummy memory transistors MTDD, and the dummy memory transistors MTDS each may be a MONOS type memory transistor using a charge storage layer of an insulation film or may be an FG type memory transistor using a charge storage layer of a conductor layer. Hereinafter, the present embodiment describes an example of the MONOS type memory transistor.

The select transistor ST1 is used for selecting a string unit SU in the various operations. FIG. 2 illustrates the select transistors ST1 (ST1a, ST1b), but the number of the select transistors ST1 is not limited in particular.

The select transistor ST2 is used for supplying a desired voltage to a string unit SU in the various operations. FIG. 2 illustrates the select transistors ST2 (ST2a, ST2b), but the number of the select transistors ST2 is not limited in particular.

In each of the NAND strings NS, a drain of the select transistor ST1 is connected to a corresponding bit line BL. A source of the select transistor ST1 is connected to one end of the serially-connected memory transistors MT. The other end of the serially-connected memory transistors MT is connected to a drain of the select transistor ST2.

In the same block BLK, the sources of the select transistors ST2 are connected to a source line SL. Each gate of the select transistors ST1a of the string units SU is connected to a corresponding select gate line SGD. Each gate of the select transistors ST1b is connected to a corresponding select gate line SGDT. Each control gate of the memory transistors MT is connected to a corresponding word line WL. Each control gate of the dummy memory transistors MTDD is connected to a corresponding dummy word line DD. Each control gate of the dummy memory transistors MTDS is connected to a corresponding dummy word line DS. Each gate of the select transistors ST2a is connected to a select gate line SGS. Each gate of the select transistors ST2b is connected to a select gate line SGSB.

In the blocks BLK, the NAND strings NS to which the same column address CA is assigned are connected to the same bit line BL. The source lines SL are connected between the plural blocks BLK.

Figure 3:
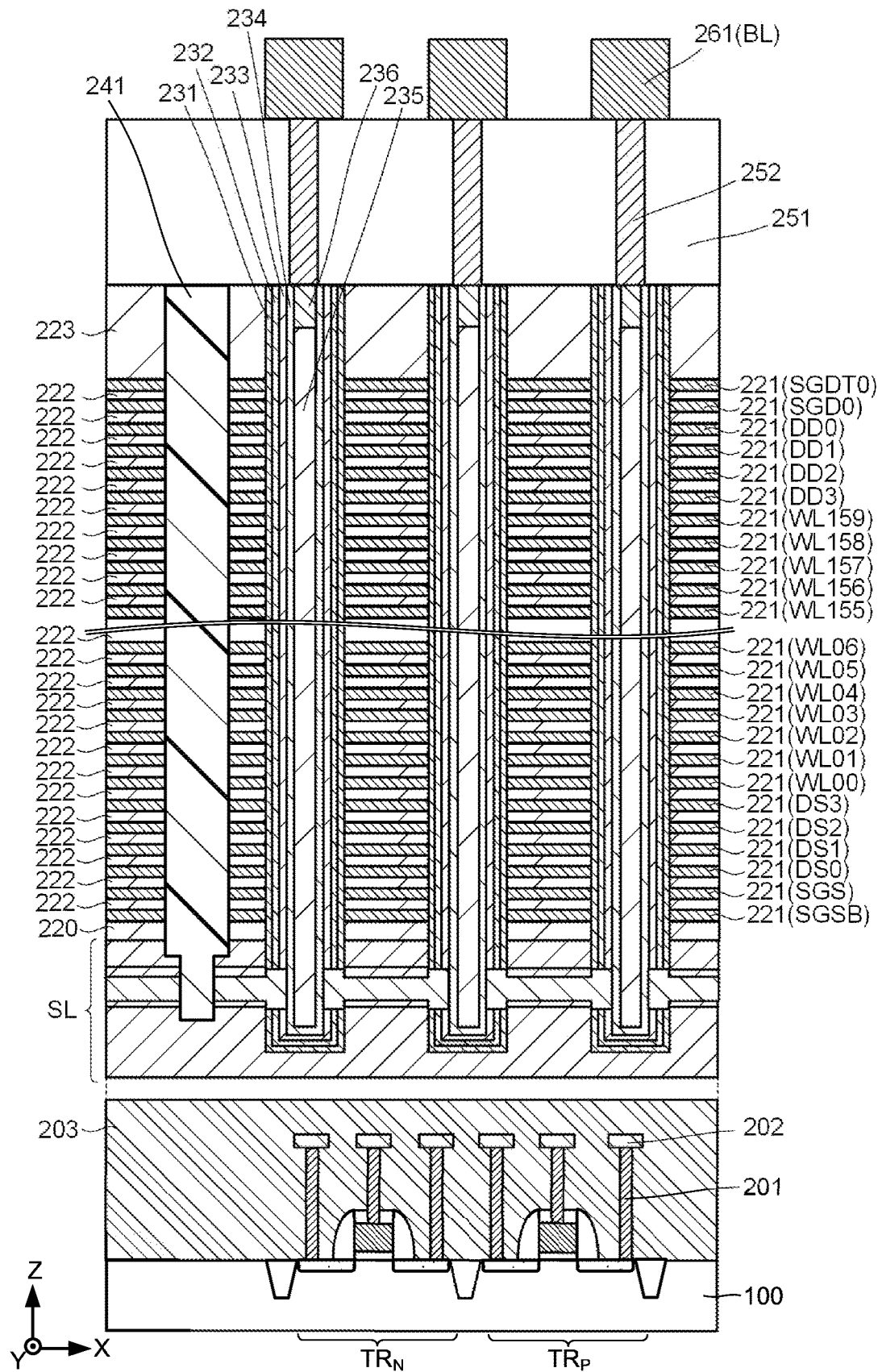
FIG. 3 is a schematic sectional view for explaining an example of a cross-sectional structure of a semiconductor memory device.
Figure 4:
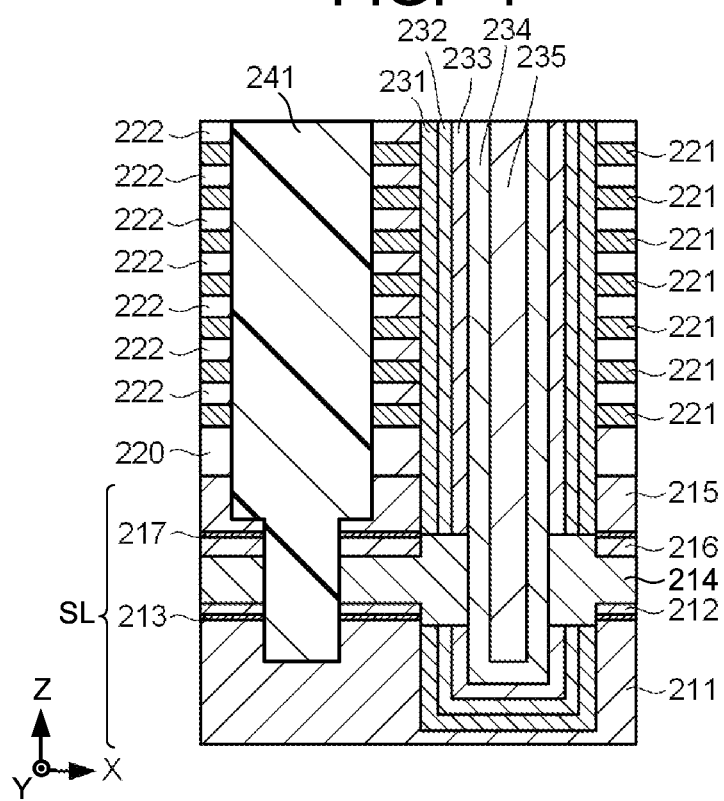
FIG. 4 is an enlarged view illustrating a part of FIG. 3.

Next, an example of a cross-sectional structure of the semiconductor memory device 101 will be described. FIG. 3 is a schematic sectional view for explaining an example of a cross-sectional structure of the semiconductor memory device 101, and illustrates an X axis direction substantially parallel to a surface of a semiconductor substrate 100, a Y axis direction substantially perpendicular to the X axis along the surface, and a Z axis direction which substantially perpendicularly intersects the surface. FIG. 4 is an enlarged view illustrating a part of FIG. 3. The term of substantially parallel may also indicate a direction deviated by ±10 degrees from a parallel direction, for example. The term of substantially perpendicular may also indicate a direction deviated by ±10 degrees from a perpendicular direction, for example.

The semiconductor memory device 101 of the present embodiment includes peripheral circuits such as the command register 111, the address register 112, the sequencer 113, the driver 114, the row decoder 115, and the sense amplifier 116, the peripheral circuits being below the memory cell array 110.

The semiconductor memory device illustrated in FIG. 3 includes a field-effect transistor $TR_N$ and a field-effect transistor $TR_P$ which are provided on the semiconductor substrate 100, conductive layers 201, conductive layers 202, an insulation layer 203, the source line SL, an insulation layer 220, conductive layers 221, insulation layers 222, an insulation layer 223, block insulation films 231, charge storage films 232, tunnel insulation films 233, semiconductor layers 234, core insulation layers 235, cap layers 236, a conductive layer 241, an insulation layer 251, contact layers 252, and conductive layers 261 (the bit lines BL). The source line SL, the conductive layers 221, the insulation layers 222, the block insulation films 231, the charge storage films 232, the tunnel insulation films 233, the semiconductor layers 234, the core insulation layers 235, the cap layers 236, and the conductive layer 241 constitute at least a part of the memory cell array 110.

The field-effect transistor $TR_N$ and the field-effect transistor $TR_P$ are provided below the memory cell array 110. The field-effect transistor $TR_N$ is an N-channel type transistor. The field-effect transistor $TR_P$ is a P-channel type transistor. Each of the field-effect transistor $TR_N$ and the field-effect transistor $TR_P$ constitute at least a part of the peripheral circuits.

Each conductive layer 201 functions as a contact plug. The conductive layers 202 function as one wiring layer, and each conductive layer 202 functions as corresponding wirings of the wiring layer. Each of the conductive layers 202 is connected to any of a gate, a source, and a drain of the field-effect transistor $TR_N$ or the field-effect transistor $TR_P$ via the conductive layer 201, for example. The conductive layer 201 and the conductive layer 202 contain a metal.

The insulation layer 203 insulates a region between the field-effect transistor $TR_N$ and the field-effect transistor $TR_P$, a region between the conductive layers 201, and a region between the conductive layers 202, for example. The insulation layer 203 contains oxygen and silicon, for example. The field-effect transistor $TR_N$ and the field-effect transistor $TR_P$ are connected to the memory cell array 110 via not only the conductive layers 201 and the conductive layers 202 but also other wiring layers and contact plugs, but illustration of these will be omitted in the present embodiment for the sake of convenience.

The source line SL has a first stack. For example, as illustrated in FIG. 4, the first stack has a semiconductor layer 211, a semiconductor layer 212, an intermediate layer 213, a semiconductor layer 214, a semiconductor layer 215, a semiconductor layer 216, and an intermediate layer 217.

Each of the semiconductor layer 211, the semiconductor layer 212, the semiconductor layer 214, the semiconductor layer 215, and the semiconductor layer 216 is a polycrystalline semiconductor layer such as polysilicon containing an N-type impurity element, for example. Examples of the N-type impurity element include phosphorus.

The semiconductor layer 211 is provided above the semiconductor substrate 100 illustrated in FIG. 3. The semiconductor layer 211 has a first average crystal grain size. The first average crystal grain size is 300 nm or more, for example. When the first average crystal grain size is less than 300 nm, an electrical resistance of the source line SL is sometimes increased. Although an upper limit of the first average crystal grain size is not limited in particular, it is 400 nm or more, for example. The electrical resistance of the source line SL can be reduced by increasing the average crystal grain size of the semiconductor layer 211.

The semiconductor layer 212 is provided on the intermediate layer 213. The semiconductor layer 212 has a second average crystal grain size which is smaller than the first average crystal grain size. The second average crystal grain size is 100 nm or more and 150 nm or less, for example. When the second average crystal grain size is less than 100 nm, the electrical resistance of the source line SL is sometimes increased. When the second average crystal grain size exceeds 150 nm, this sometimes leads to an increase in an average crystal grain size of the semiconductor layer 214, as will be described later. The semiconductor layer 212 is thinner than the semiconductor layer 211. As the semiconductor layer 212 becomes thinner, the average crystal grain size of the semiconductor layer 212 is more likely to be reduced.

The intermediate layer 213 is a compound layer containing oxygen, nitrogen, or carbon, for example. The intermediate layer 213 is provided on the semiconductor layer 211. The intermediate layer 213 is provided between the semiconductor layer 211 and the semiconductor layer 212, and divides the semiconductor layer 211 and the semiconductor layer 212. This makes it possible to prevent an increase in the average crystal grain size of the semiconductor layer 212 (the second average crystal grain size), which is caused by the semiconductor layer 211. The intermediate layer 213 is thinner than the semiconductor layer 212. A thickness of the intermediate layer 213 is 50 nm or less, for example. When the thickness exceeds 50 nm, the intermediate layer 213 is sometimes removed during a formation step of the source line SL. Further, the thickness of the intermediate layer 213 is preferably smaller than a distance between memory pillars to be described later.

The semiconductor layer 214 is provided between the semiconductor layer 212 and the semiconductor layer 216. The semiconductor layer 214 is provided on the semiconductor layer 212 and the semiconductor layer 216. The semiconductor layer 214 has a third average crystal grain size which is smaller than the first average crystal grain size. The third average crystal grain size is 100 nm or more and 150 nm or less, for example.

The semiconductor layer 214 penetrates the block insulation film 231, the charge storage film 232, and the tunnel insulation film 233 along a direction substantially parallel to the X axis, and is provided on the semiconductor layer 234.

The semiconductor layer 215 is provided on the intermediate layer 217. The semiconductor layer 215 has a fourth average crystal grain size. The fourth average crystal grain size is 300 nm or more, for example. When the fourth average crystal grain size is less than 300 nm, the electrical resistance of the source line SL is sometimes increased. Although an upper limit of the fourth average crystal grain size is not limited in particular, it is 400 nm or more, for example. The electrical resistance of the source line SL can be reduced by increasing the average crystal grain size of the semiconductor layer 215.

The semiconductor layer 216 is provided on the semiconductor layer 214. The semiconductor layer 216 has a fifth average crystal grain size which is smaller than the fourth average crystal grain size. The fifth average crystal grain size may be smaller than the first average crystal grain size. The fifth average crystal grain size is 100 nm or more and 150 nm or less, for example. When the fifth average crystal grain size is less than 100 nm, the electrical resistance of the source line SL is sometimes increased. When the fifth average crystal grain size exceeds 150 nm, this sometimes leads to an increase in the average crystal grain size of the semiconductor layer 214, as will be described later. The semiconductor layer 216 is thinner than the semiconductor layer 215. As the semiconductor layer 216 becomes thinner, the average crystal grain size of the semiconductor layer 216 is more likely to be reduced.

The intermediate layer 217 is a compound layer containing oxygen, nitrogen, or carbon, for example. The intermediate layer 217 is provided on the semiconductor layer 216. The intermediate layer 217 is provided between the semiconductor layer 215 and the semiconductor layer 216, and divides the semiconductor layer 215 and the semiconductor layer 216. This makes it possible to prevent an increase in the average crystal grain size of the semiconductor layer 216 (the fifth average crystal grain size), which is caused by the semiconductor layer 215. The intermediate layer 217 is thinner than the semiconductor layer 216. A thickness of the intermediate layer 217 is 50 nm or less, for example. When the thickness exceeds 50 nm, the intermediate layer 213 is sometimes removed during the formation step of the source line SL. Further, the thickness of the intermediate layer 217 is preferably smaller than the distance between memory pillars to be described later.

The structure of the first stack is not limited to the structure illustrated in FIG. 4, and the first stack is only required to have the intermediate layer of at least either the intermediate layer 213 or the intermediate layer 217. When the first stack does not have the intermediate layer 213, the semiconductor layer 212 is not formed, and the semiconductor layer 211 is provided on the semiconductor layer 214. When the first stack does not have the intermediate layer 217, the semiconductor layer 216 is not formed, and the semiconductor layer 215 is provided on the semiconductor layer 214. Specifically, the first stack of the source line SL is only required to have the polycrystalline semiconductor layer of at least either the semiconductor layer 212 or the semiconductor layer 216.

The average crystal grain size of each of the semiconductor layer 211, the semiconductor layer 212, the semiconductor layer 214, the semiconductor layer 215, and the semiconductor layer 216 can be calculated from an observation image which is acquired by performing observation on a cross section parallel to an X-Y plane of each of the polycrystalline semiconductor layers, with the use of a Transmission Electron Microscope (TEM), for example. For instance, the average crystal grain size can be calculated from a TEM image in a field of view of about 3 μm in length and about 3 μm in width, using Intercept method (which is also called Heyn method) or Planimetric method (which is also called Jeffries method).

The insulation layer 220 is provided above the first stack. The insulation layer 220 contains oxygen and silicon, for example.

The memory cell array 110 has a second stack. The second stack has conductive layers 221 and insulation layers 222 which are alternately stacked. The conductive layers 221 can constitute one of the select gate line SGSB, the select gate line SGS, the dummy word lines DS0 to DS3, the word lines WL00 to WL159, the dummy word lines DD0 to DD3, the select gate lines SGD0 to SGD2, and the select gate lines SGDT0 to SGDT2, respectively. The select gate lines SGD0 to SGD2 are arranged at different positions on the X-Y plane, and are arranged on the same layer in the Z axis direction. Further, the select gate lines SGDT0 to SGDT2 are arranged at different positions on the X-Y plane, and are arranged on the same layer in the Z axis direction. Accordingly, in FIG. 3, the select gate line SGD0 and the select gate line SGDT0 are illustrated, as an example. The conductive layer 221 contains a metal such as tungsten. The insulation layer 222 contains oxygen and silicon, for example.

The insulation layer 223 is provided on the second stack. The insulation layer 223 contains oxygen and silicon formed using tetraethylorthosilicate (TEOS), for example.

A pillar (memory pillar) has the block insulation film 231, the charge storage film 232, the tunnel insulation film 233, the semiconductor layer 234, and the core insulation layer 235. The block insulation film 231, the charge storage film 232, the tunnel insulation film 233, the semiconductor layer 234, and the core insulation layer 235 extend along a direction substantially parallel to the Z axis. One memory pillar corresponds to one NAND string NS. The memory pillar has a memory layer. The memory layer has the block insulation film 231, the charge storage film 232, and the tunnel insulation film 233. The memory layer penetrates the second stack in a direction substantially perpendicular to the Z axis. The memory layer is provided between the semiconductor layer 234 and the conductive layer 221 in a direction substantially parallel to the X axis.

Each of the block insulation film 231 and the core insulation layer 235 contains oxygen and silicon, for example. The charge storage film 232 contains nitrogen and silicon, for example. The tunnel insulation film 233 contains oxygen and silicon, for example. The block insulation film 231 and the tunnel insulation film 233 may further contain nitrogen, for example.

More concretely, a hole corresponding to the memory pillar is formed by penetrating the conductive layers 221. On a side surface of the hole, the block insulation film 231, the charge storage film 232, and the tunnel insulation film 233 are stacked in order. Subsequently, the semiconductor layer 234 is formed so that its side surface is provided on the tunnel insulation film 233 and the semiconductor layer 214.

The semiconductor layer 234 penetrates the second stack in a direction substantially parallel to the Z axis, and is connected to the source line SL and the bit line BL. The semiconductor layer 234 has channel formation regions of the select transistors ST1, the select transistors ST2, the memory transistors MT, the dummy memory transistors MTDS, and the dummy memory transistors MTDD. Therefore, the semiconductor layer 234 functions as a signal line connecting current paths of the select transistors ST1, the select transistors ST2, the memory transistors MT, the dummy memory transistors MTDS, and the dummy memory transistors MTDD.

The semiconductor layer 234 is provided on a surface of the tunnel insulation film 233. The semiconductor layer 234 includes a polycrystalline semiconductor layer such as polysilicon, for example. The semiconductor layer 234 may also be formed by crystallizing an amorphous silicon film, for example.

The core insulation layer 235 is provided on the inner side of the semiconductor layer 234. The core insulation layer 235 penetrates the second stack in a direction substantially parallel to the Z axis.

As illustrated in FIG. 3, the cap layer 236 is provided on the core insulation layer 235, and is provided on the semiconductor layer 234. The cap layer 236 contains, for example, oxygen and silicon, or polysilicon containing an N-type impurity element. For example, when the cap layer 236 contains oxygen and silicon, it is possible to prevent diffusion of an impurity element. When the cap layer 236 is an insulation layer, an N-type impurity element such as phosphorus or arsenic may be doped in a surface of the cap layer 236. Further, when the cap layer 236 includes a polycrystalline semiconductor layer such as polysilicon containing an N-type impurity element, it is possible to reduce a connection resistance between the cap layer 236 and the contact layer 252.

The conductive layer 241 is a contact layer called Local Interconnect (Li). The conductive layer 241 penetrates the second stack in a direction substantially parallel to the Z axis, and is connected to the source line SL. The conductive layer 241 is provided on the semiconductor layer 214. The conductive layer 241 contains tungsten, for example.

The insulation layer 251 is provided above the second stack and on the insulation layer 223. The insulation layer 251 contains oxygen and silicon formed using TEOS, for example. The contact layer 252 functions as a contact plug. The conductive layer 261 is provided on the cap layer 236 via the contact layer 252. The conductive layer 261 functions as the bit line BL. The contact layer 252 and the conductive layer 261 contain a metal, for example.

The memory pillar, and the conductive layer 221 of each word line WL functions as the memory transistor MT at an intersection therebetween. The memory pillar, and the conductive layer 221 of each dummy word line DD functions as the dummy memory transistor MTDD at an intersection there between. The memory pillar, and the conductive layer 221 of each dummy word line DS functions as the dummy memory transistor MTDS an intersection therebetween. The memory pillar, and the conductive layer 221 of each select gate line SGD functions as the select transistor ST1a at an intersection therebetween. The memory pillar, and the conductive layer 221 of each select gate line SGDT functions as the select transistor ST1b at an intersection therebetween. The memory pillar, and the conductive layer 221 of the select gate line SGS functions as the select transistor ST2a at an intersection therebetween. The memory pillar, and the conductive layer 221 of the select gate line SGSB functions as the select transistor ST2b at an intersection therebetween.

Figure 5:
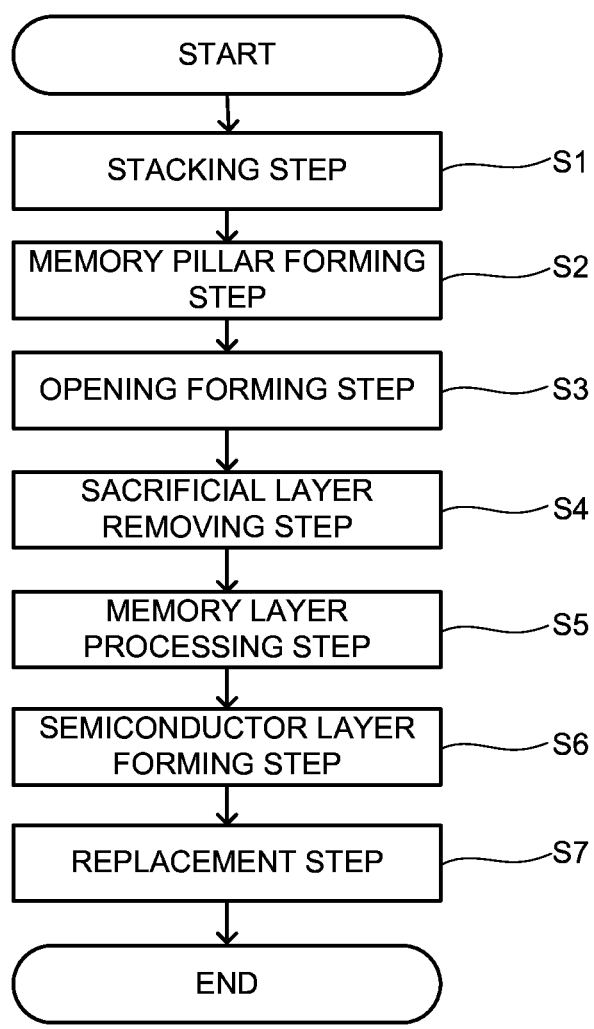
FIG. 5 is a flow chart for explaining a method example of manufacturing the semiconductor memory device.

Next, a method example of manufacturing the semiconductor memory device illustrated in FIG. 3 will be described. FIG. 5 is a flow chart for explaining a method example of manufacturing the semiconductor memory device. In this example, a steps related to formation of the source line SL will be described in particular, in which cross-sectional structures in the middle of the manufacture of the part illustrated in FIG. 4 will be illustrated in FIG. 6 to FIG. 14, and illustration of the rest will be omitted.

The method example of manufacturing the semiconductor memory device includes a stacking step S1, a memory pillar forming step S2, an opening forming step S3, a sacrificial layer removing step S4, a memory layer processing step S5, a semiconductor layer forming step S6, and a replacement step S7, as illustrated in FIG. 5. These steps are not limited to be performed in the order of steps illustrated in FIG. 5.

[Stacking Step S1]

Figure 6:
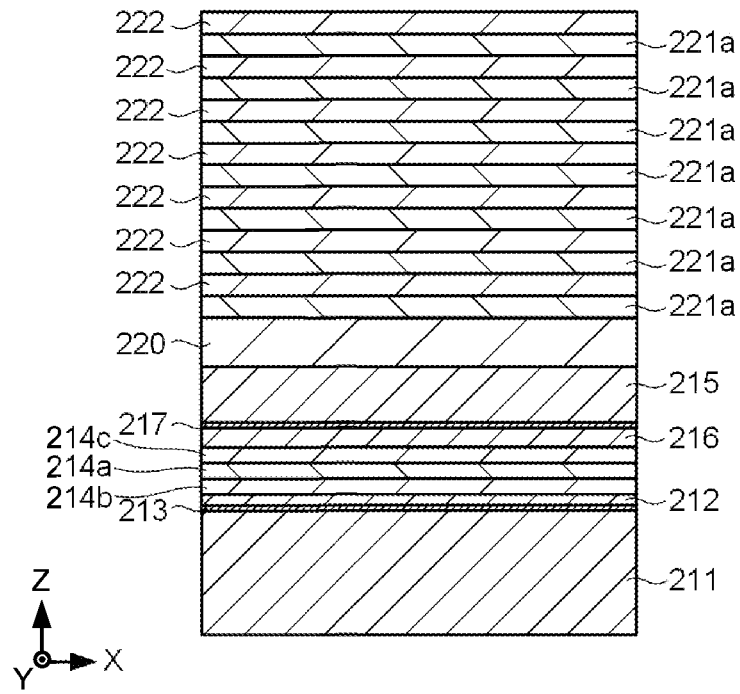
FIG. 6 is a view illustrating an example of a cross-sectional structure in the middle of manufacturing the semiconductor memory device.

As illustrated in FIG. 6, the semiconductor layer 211, the intermediate layer 213, the semiconductor layer 212, a protection layer 214b, a sacrificial layer 214a, a protection layer 214c, the semiconductor layer 216, the intermediate layer 217, and the semiconductor layer 215 are stacked to form a third stack, which will be the first stack later. The third stack is formed above the peripheral circuits provided on the surface of the semiconductor substrate 100 illustrated in FIG. 3.

When the intermediate layer 213 or the intermediate layer 217 contains oxygen, the intermediate layer 213 or the intermediate layer 217 can be formed by oxidizing a surface of the semiconductor layer 211 or the semiconductor layer 216 at a temperature of 350° C. or less, for example. The intermediate layer 213 or the intermediate layer 217 formed by the oxidation and containing oxygen is also called a low-temperature oxide film (LTO film). The formation method thereof is not limited to this formation method, and the intermediate layer 213 or the intermediate layer 217 containing oxygen may be formed by forming the semiconductor layer 211 or the semiconductor layer 216 while exposing it to oxygen atmosphere, or may be formed by immersing it in a chemical solution containing hydrogen peroxide ($H_2O_2$) or ozone ($O_3$). When the intermediate layer 213 or the intermediate layer 217 contains nitrogen, the intermediate layer 213 or the intermediate layer 217 can be formed by nitriding the surface of the semiconductor layer 211 or the semiconductor layer 216, for example. When the intermediate layer 213 or the intermediate layer 217 contains carbon, the intermediate layer 213 or the intermediate layer 217 can be formed by doping carbon in the surface of the semiconductor layer 211 or the semiconductor layer 216, for example.

The sacrificial layer 214a is formed on the protection layer 214b. The sacrificial layer 214a is provided between the protection layer 214b and the protection layer 214c. The sacrificial layer 214a is for forming the semiconductor layer 214. The sacrificial layer 214a contains nitrogen and silicon, for example. The sacrificial layer 214a can be formed using a chemical vapor deposition method (CVD), for example.

The protection layer 214b is formed on the semiconductor layer 212. The protection layer 214b is provided between the sacrificial layer 214a and the semiconductor layer 212. The protection layer 214b is for protecting the semiconductor layer 212 when removing the sacrificial layer 214a. The protection layer 214b contains oxygen and silicon, for example. The protection layer 214b can be formed using the CVD, for example.

The protection layer 214c is formed on the sacrificial layer 214a. The protection layer 214c is provided between the sacrificial layer 214a and the semiconductor layer 216. The protection layer 214c is for protecting the semiconductor layer 216 when removing the sacrificial layer 214a. The protection layer 214c contains oxygen and silicon, for example. The protection layer 214c can be formed using the CVD, for example.

In addition, the insulation layer 220 is formed on the semiconductor layer 215. Further, each of sacrificial layers 221a and each of the insulation layers 222 are alternately stacked above the insulation layer 220, to form a fourth stack including a plurality of the sacrificial layers 221a and a plurality of the insulation layers 222, the fourth stack forming the second stack later. Further, the insulation layer 223 is formed on the fourth stack. The insulation layer 220, the sacrificial layers 221a, the insulation layers 222, and the insulation layer 223 can be formed using the CVD, for example.

The sacrificial layers 221a are provided for forming the conductive layers 221. The sacrificial layers 221a and the insulation layers 222 extend in a direction substantially parallel to the X axis, for example. The sacrificial layers 221a contain nitrogen and silicon, for example.

[Memory Pillar Forming Step S2]

The semiconductor layer 211, the semiconductor layer 212, the intermediate layer 213, the sacrificial layer 214a, the protection layer 214b, the protection layer 214c, the semiconductor layer 215, the semiconductor layer 216, the intermediate layer 217, the insulation layer 220, the sacrificial layers 221a, the insulation layers 222, and the insulation layer 223 are partly removed in a direction substantially parallel to the Z axis to form an opening (a memory hole). The stack can be partly removed using reactive ion etching (RIE), for example.

Figure 7:
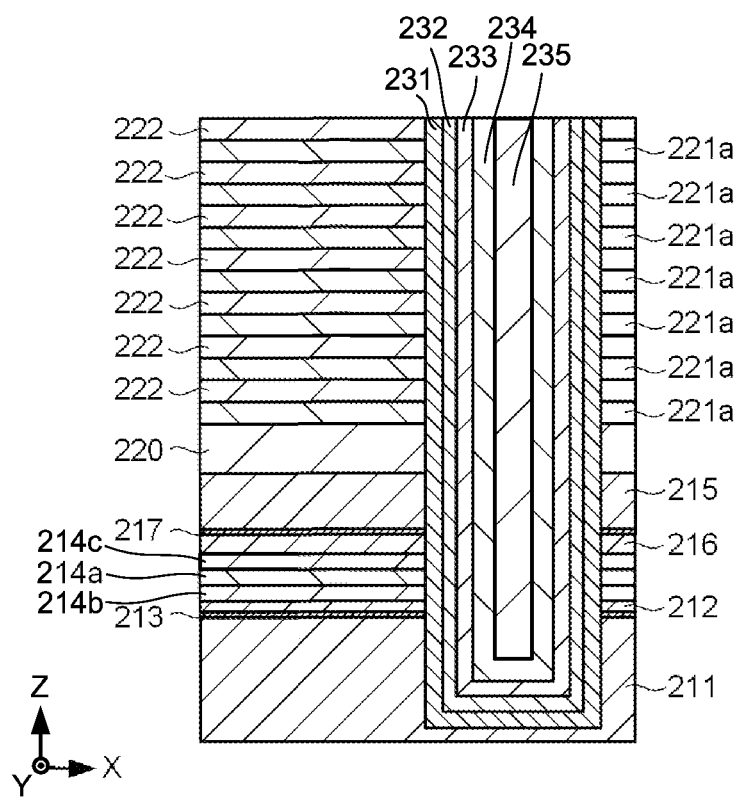
FIG. 7 is a view illustrating an example of the cross-sectional structure in the middle of manufacturing the semiconductor memory device.

Next, as illustrated in FIG. 7, the block insulation film 231, the charge storage film 232, the tunnel insulation film 233, the semiconductor layer 234, and the core insulation layer 235 are formed in the memory hole. These films can be formed using the CVD, sputtering, or an atomic layer deposition method (ALD), for example.

Further, the cap layer 236 is formed. The cap layer 236 can be formed using the CVD or the ALD, for example. The step before or after forming the cap layer 236 may include doping an N-type impurity element such as arsenic or phosphorus or a P-type impurity element such as boron into the semiconductor layer 234. This doping can form an impurity semiconductor region in a region of the semiconductor layer 234, the region being overlapping with the select gate lines SGD, SGDT, for example. The impurity semiconductor region may be formed by forming the cap layer 236 from a semiconductor layer containing the N-type impurity element such as phosphorus, and then performing a later-described heat treatment to diffuse the impurity element from the cap layer 236 to the semiconductor layer 234.

The block insulation film 231, the charge storage film 232, the tunnel insulation film 233, the semiconductor layer 234, and the cap layer 236 are partly removed through etch back using the RIE or dry etching, for example, resulting in that a surface (upper surface) of the insulation layer 223 is exposed.

[Opening Forming Step S3]

Figure 8:
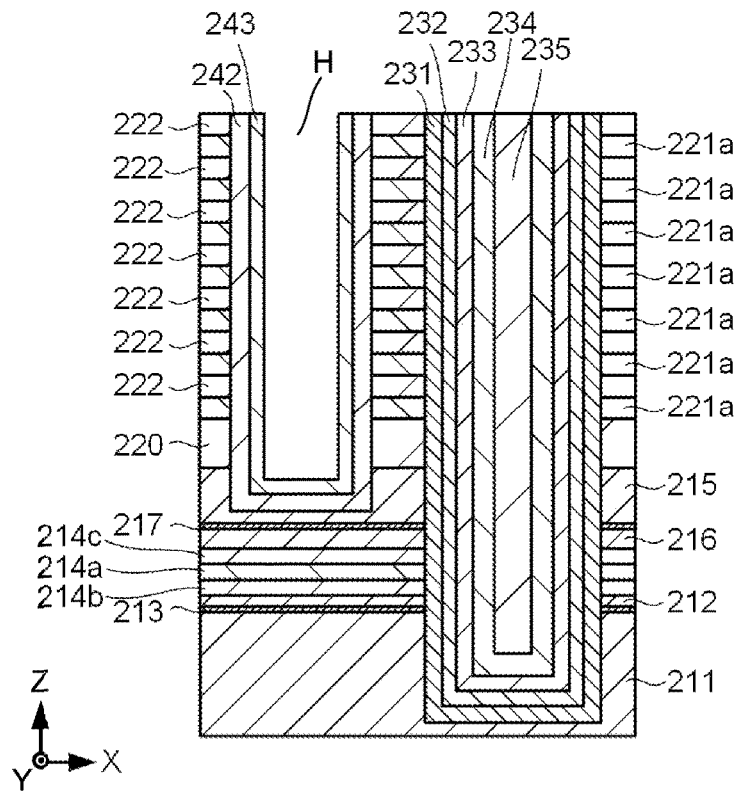
FIG. 8 is a view illustrating an example of the cross-sectional structure in the middle of manufacturing the semiconductor memory device.

As illustrated in FIG. 8, an opening H is formed, the opening H extending to the semiconductor layer 215 in a direction substantially parallel to the Z axis through the insulation layer 220, the sacrificial layers 221a, the insulation layers 222, and the insulation layer 223. The opening H is formed by partly removing the insulation layer 220, the sacrificial layers 221a, the insulation layers 222, and the insulation layer 223 in the direction substantially parallel to the Z axis using the RIE, for example.

Next, as illustrated in FIG. 8, a protection layer 242 and a protection layer 243 are formed in order on an inner wall surface and an inner bottom surface of the opening H. The protection layer 242 contains oxygen and silicon, for example. The protection layer 243 includes a semiconductor layer such as amorphous silicon, for example. The protection layer 242 and the protection layer 243 are for protecting the inner wall surface of the opening H. The protection layer 242 and the protection layer 243 can be formed using the CVD or the ALD, for example.

Figure 9:
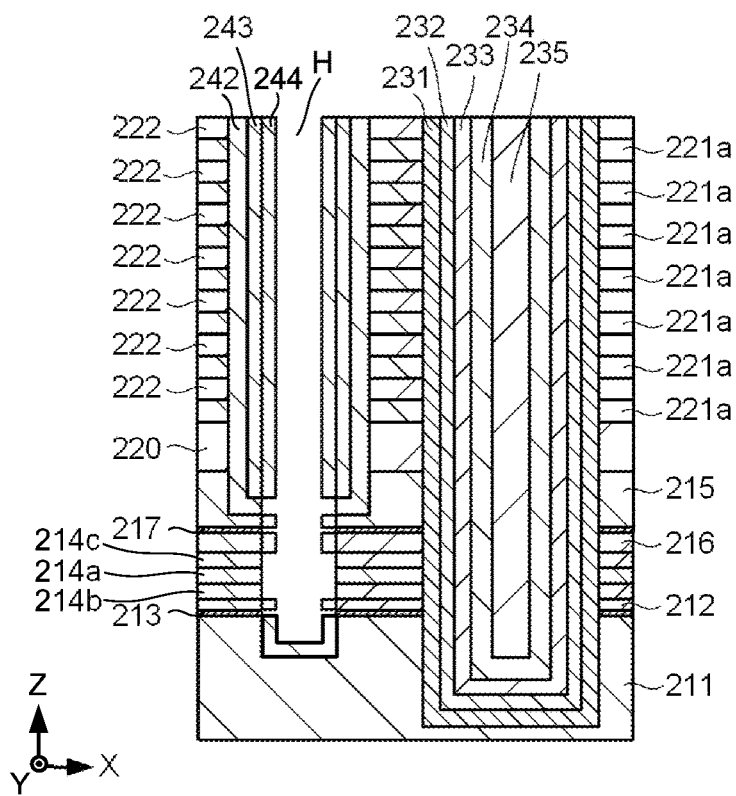
FIG. 9 is a view illustrating an example of the cross-sectional structure in the middle of manufacturing the semiconductor memory device.

Further, as illustrated in FIG. 9, the protection layer 242, the protection layer 243, the semiconductor layer 215, the intermediate layer 217, the semiconductor layer 216, the protection layer 214c, the sacrificial layer 214a, the protection layer 214b, the semiconductor layer 212, the intermediate layer 213, and the semiconductor layer 211 are partly removed in a direction substantially parallel to the Z axis at a bottom portion of the opening H. These layers can be partly removed using the RIE, for example. After that, an oxide layer 244 is formed on portions facing on the opening H, the portions being of the protection layer 243, the semiconductor layer 211, the semiconductor layer 215, the semiconductor layer 214, and the semiconductor layer 216. The oxide layer 244 contains oxygen and silicon, for example. The oxide layer 244 can be formed by oxidizing the portions facing on the opening H.

[Sacrificial Layer Removing Step S4]

Figure 10:
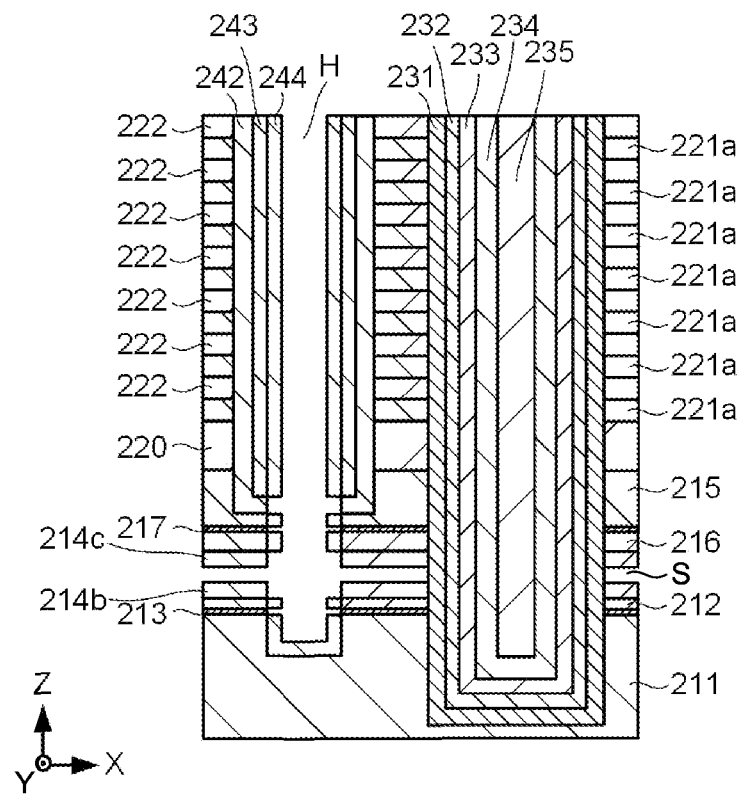
FIG. 10 is a view illustrating an example of the cross-sectional structure in the middle of manufacturing the semiconductor memory device.

As illustrated in FIG. 10, the sacrificial layer 214a is removed to form a space S. The sacrificial layer 214a can be removed through wet etching using phosphoric acid, for example. As described above, the formation of the oxide layer 244 before the sacrificial layer removing step S4, can protect the semiconductor layer 211, the semiconductor layer 212, the semiconductor layer 215, and the semiconductor layer 216 from the wet etching.

[Memory Layer Processing Step S5]

Figure 11:
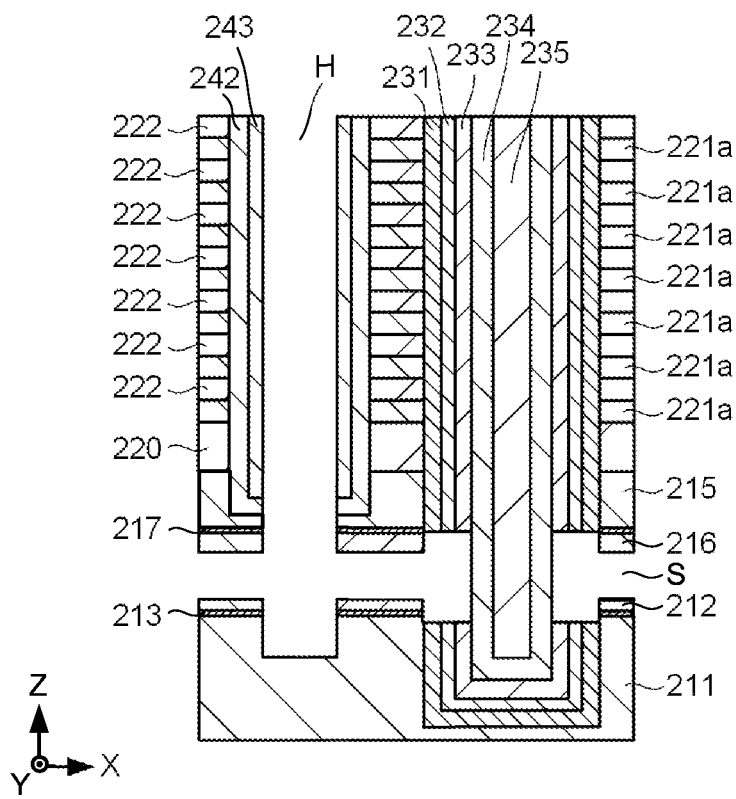
FIG. 11 is a view illustrating an example of the cross-sectional structure in the middle of manufacturing the semiconductor memory device.

As illustrated in FIG. 11, each of the block insulation film 231, the charge storage film 232, and the tunnel insulation film 233 is partly removed, to expose a part of the semiconductor layer 234 in a direction substantially parallel to the X axis. In this step, the block insulation film 231, the charge storage film 232, and the tunnel insulation film 233 are partly removed also in a direction substantially parallel to the Z axis. The block insulation film 231 can be partly removed through wet etching using hydrofluoric acid (dilute hydrofluoric acid), for example. The wet etching can also remove the protection layer 214b, the protection layer 214c, and the oxide layer 244. The charge storage film 232 can be partly removed through wet etching using phosphoric acid, for example. The tunnel insulation film 233 can be partly removed through wet etching using hydrofluoric acid (dilute hydrofluoric acid) or chemical dry etching (CDE), for example.

[Semiconductor Layer Forming Step S6]

Figure 12:
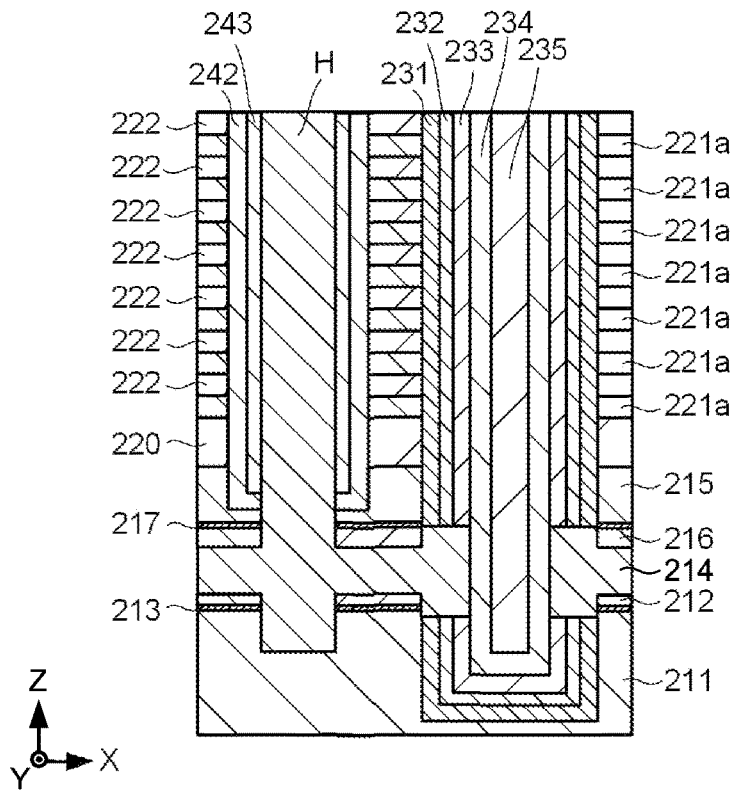
FIG. 12 is a view illustrating an example of the cross-sectional structure in the middle of manufacturing the semiconductor memory device.

As illustrated in FIG. 12, the semiconductor layer 214 is formed, the semiconductor layer 214 filling the opening H and the space S. The semiconductor layer 214 can be formed by forming an amorphous semiconductor layer such as amorphous silicon containing phosphorus using the CVD or the ALD, and then crystallizing the amorphous semiconductor layer through later-described heat treatment, for example.

Figure 13:
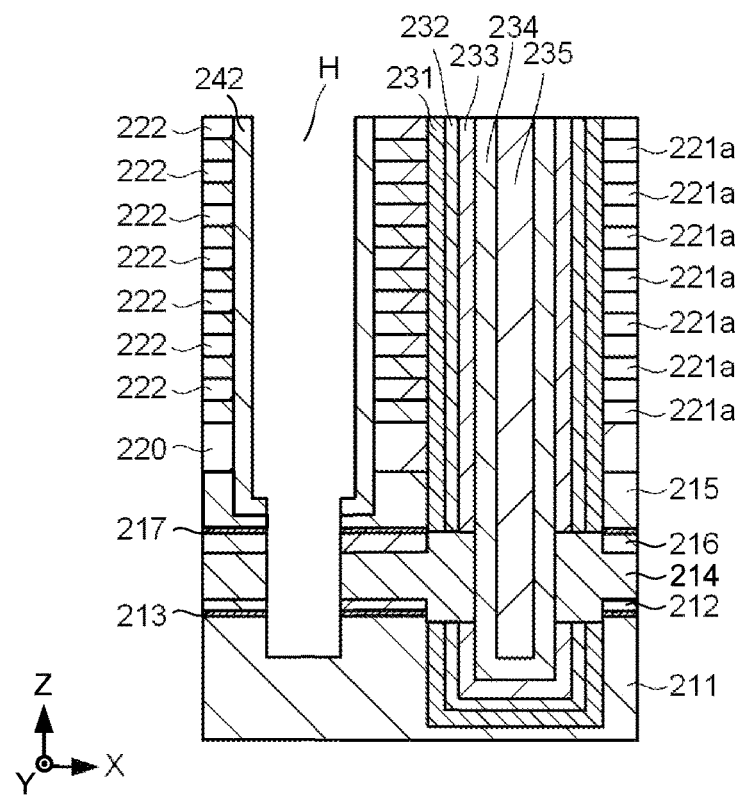
FIG. 13 is a view illustrating an example of the cross-sectional structure in the middle of manufacturing the semiconductor memory device.
Figure 14:
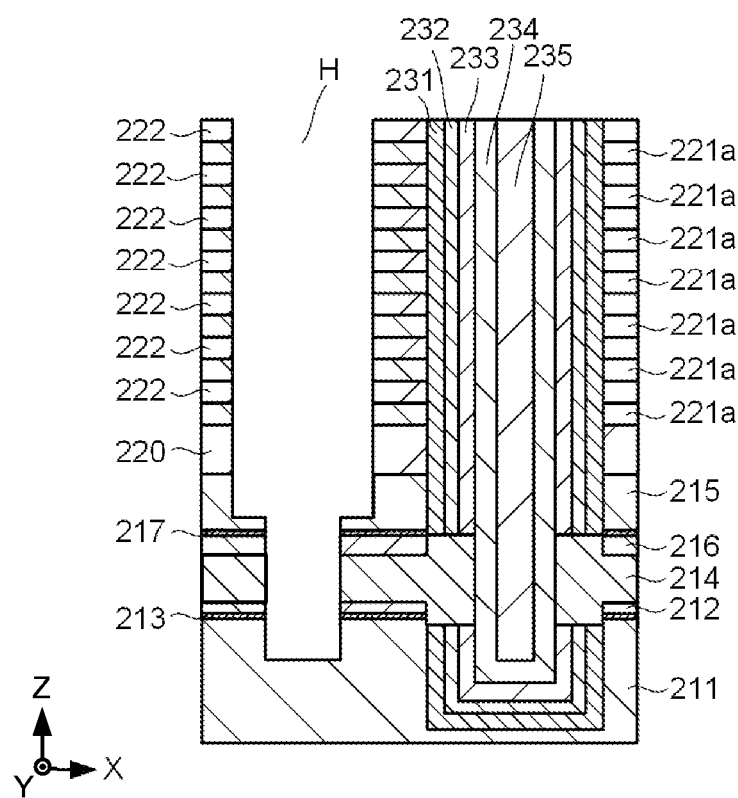
FIG. 14 is a view illustrating an example of the cross-sectional structure in the middle of manufacturing the semiconductor memory device.

Next, as illustrated in FIG. 13, the semiconductor layer 214 and the protection layer 243 are partly removed in a direction substantially parallel to the Z axis in the opening H, and thus portions face the opening H is exposed, the portions being of the semiconductor layer 211, the semiconductor layer 212, the intermediate layer 213, the semiconductor layer 214, the semiconductor layer 215, the semiconductor layer 216, the intermediate layer 217, and the protection layer 243. The semiconductor layer 214 can be partly removed through etch back by chemical dry etching using a nitrogen trifluoride-based gas, for example. After that, the protection layer 242 is removed through wet etching or dry etching, as illustrated in FIG. 14.

When an amorphous semiconductor layer such as an amorphous silicon layer is used for the semiconductor layer 214, the semiconductor layer 234, and the cap layer 236, the amorphous semiconductor layer is crystallized by heat treatment, and thus a polycrystalline semiconductor layer is formed. Further, the doped impurity element is activated by the heat treatment.

The semiconductor layer 214 is formed on the semiconductor layer 212 and the semiconductor layer 216 each having an average crystal grain size which is smaller than that of each of the semiconductor layer 211 and the semiconductor layer 215. Accordingly, the semiconductor layer 214 is crystallized along crystal planes of the semiconductor layer 212 and the semiconductor layer 216. This can achieve the average crystal grain size of the semiconductor layer 214 smaller than the average crystal grain size of each of the semiconductor layer 211 and the semiconductor layer 216. The third stack forms the first stack after crystallizing the semiconductor layer 214.

[Replacement Step S7]

The sacrificial layers 221a are removed, and the conductive layers 221 are formed at the removed portions. The sacrificial layers 221a can be removed using dry etching or wet etching, for example. The conductive layers 221 can be formed using the CVD or the ALD, for example. The sacrificial layers 221a are removed and the conductive layers 221 are formed, resulting in that the fourth stack forms the second stack. After that, the conductive layer 241, the insulation layer 251, the contact layer 252, and the conductive layer 261 are formed in order, resulting in that the semiconductor memory device illustrated in FIG. 3 can be manufactured.

In the semiconductor memory device of the present embodiment, the channel formation region of the memory transistor MT (the semiconductor layer 234) is not directly connected to the semiconductor substrate 100. This structure needs to apply a reverse bias voltage between a gate and a drain of at least one select transistor such as the select transistor ST1a or the select transistor ST2b to generate Gate Induced Drain Leakage (GIDL), and thus perform an erase operation. Generation of the GIDL enables to inject hole via a channel of the memory transistor MT, to eliminate a charge in the charge storage film 232.

The erase operation will be described. The blow description includes block erase operation of an example of the erase operation. The block erase operation includes selecting one block BLK and perform an erase operation to the selected block BLK.

The erase operation includes an erase pulse application operation and an erase verify operation roughly. The erase pulse application operation includes applying an erase pulse to lower a threshold voltage of the memory transistor MT. The erase verify operation includes determining whether or not the threshold voltage of the memory transistor MT is smaller than a predetermined value after the erase pulse application operation. The erase operation repeatedly switching the erase pulse application operation and the erase verify operation to lowers the threshold voltage of the memory transistor MT to an erase level.

Figure 15:
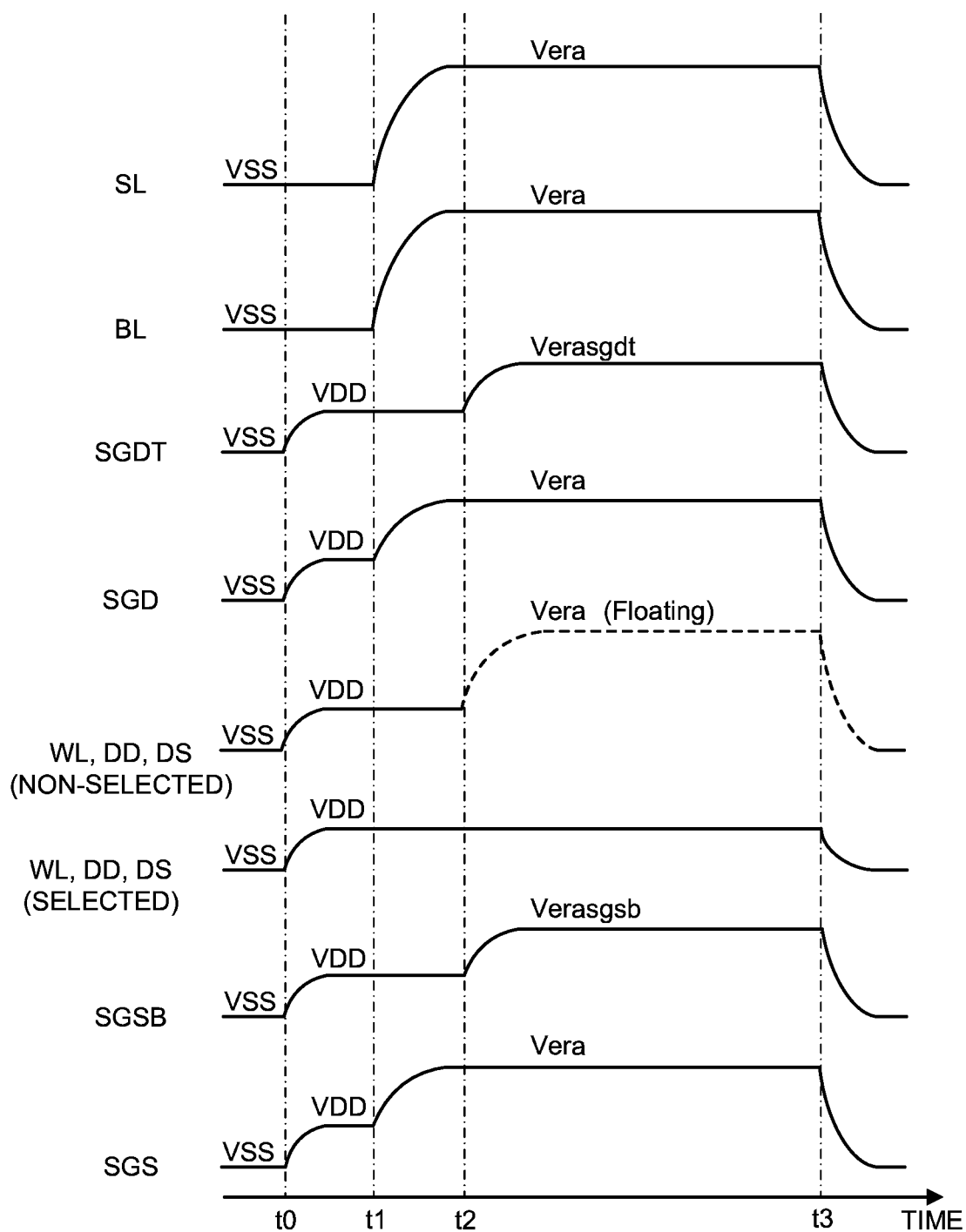
FIG. 15 is a timing chart illustrating voltages of respective wirings at a time of applying an erase pulse during a block erase operation.

FIG. 15 is a timing chart illustrating a voltage of each wiring when applying the erase pulse in the block erase operation. At a time t0, the row decoder 115 illustrated in FIG. 1 applies a voltage VDD being a power supply voltage, for example, to the select gate lines SGDT, the select gate lines SGD, the select gate line SGSB, the select gate line SGS, the word lines WL, the dummy word lines DD, and the dummy word lines DS of a block BLK being an erase target (which will be described as "selected block BLK" as well, hereinafter). Further, the row decoder 115 applies the voltage VDD to the word lines WL, the dummy word lines DD, and the dummy word lines DS of a block BLK which is not the erase target (which will be described as "non-selected block BLK" as well, hereinafter). The voltages of the word lines WL, the dummy word lines DD, and the dummy word lines DS may not be the voltage VDD.

Each voltage of the word lines WL, the dummy word lines DD, and the dummy word lines DS may also be lower than the voltage VDD so that the holes generated by the GIDL are injected in the charge storage film 232 of the corresponding memory transistors MT, dummy memory transistors MTDD, and dummy memory transistors MTDS. The row decoder 115 does not apply the voltage VDD to the word lines WL, the dummy word lines DD, and the dummy word lines DS of the non-selected block BLK, to make the word lines WL, the dummy word lines DD, and the dummy word lines DS of the non-selected block BLK to be in a floating state.

At a time t1, a voltage Vera is applied to the source line SL. Further, at the time t1, the voltage Vera is applied to the bit lines BL via the source line SL. The voltage Vera is a high voltage for generating the GIDL. Further, the row decoder 115 applies the voltage Vera to the select gate lines SGD and the select gate line SGS in order to prevent injecting holes into each charge storage film 232 of the select transistors ST1a and the select transistors ST2a. Voltages different from the voltage Vera may also be respectively applied to the select gate lines SGD and the select gate line SGS. In this case, the voltages to be applied to the select gate lines SGD and the select gate line SGS may be different from each other. For example, voltages higher than the voltage VDD may also be respectively applied to the select gate lines SGD and the select gate line SGS.

During a period from a time t2 to a time t3, the row decoder 115 applies a voltage Verasgdt to the select gate lines SGDT of the selected block BLK. Further, the row decoder 115 applies a voltage Verasgsb to the select gate line SGSB of the selected block BLK. The voltage Verasgdt is a high voltage for generating the GIDL in the select transistor ST1b, and is a voltage lower than the voltage Vera and higher than the voltage VDD. The voltage Verasgsb is a high voltage for generating the GIDL in the select transistor ST2b, and is a voltage lower than the voltage Vera and higher than the voltage VDD. The voltage Verasgdt and the voltage Verasgsb may be different from each other or the same. This can generate the GIDL flowing between each gate and each drain of the select transistors ST1b and the select transistors ST2b of the selected block BLK. The holes generated by the GIDL are injected into the charge storage film 232 of the memory transistors MT, the dummy memory transistors MTDD, and the dummy memory transistors MTDS in the selected block BLK. In other words, the holes are supplied from the source line SL side to the memory transistors MT, the dummy memory transistors MTDD, and the dummy memory transistors MTDS (data is erased).

During the period from the time t2 to the time t3, the row decoder 115 makes the word lines WL, the dummy word lines DD, and the dummy word lines DS of the non-selected block BLK to be in a floating state. Since the word lines WL, and the dummy word lines DD, DS of the non-selected block BLK are in the floating state, the voltages thereof are increased to the voltage Vera, for example, due to coupling with the semiconductor layer 234 (channel) to which the voltage Vera is applied. For this reason, the holes are not supplied to the memory transistors MT, the dummy memory transistors MTDD, and the dummy memory transistors MTDS of the non-selected block BLK (data is not erased).

After that, at the time t3, a refresh operation is performed, and a voltage VSS is applied to each wiring. The above description is the explanation of the erase operation.

The erase operation is preferably performed with diffusing an N-type impurity element such as phosphorus in a region of the semiconductor layer 234 overlapping with the select gate lines SGDT and SGSB to increase an amount of holes generated by the GIDL.

Figure 16:
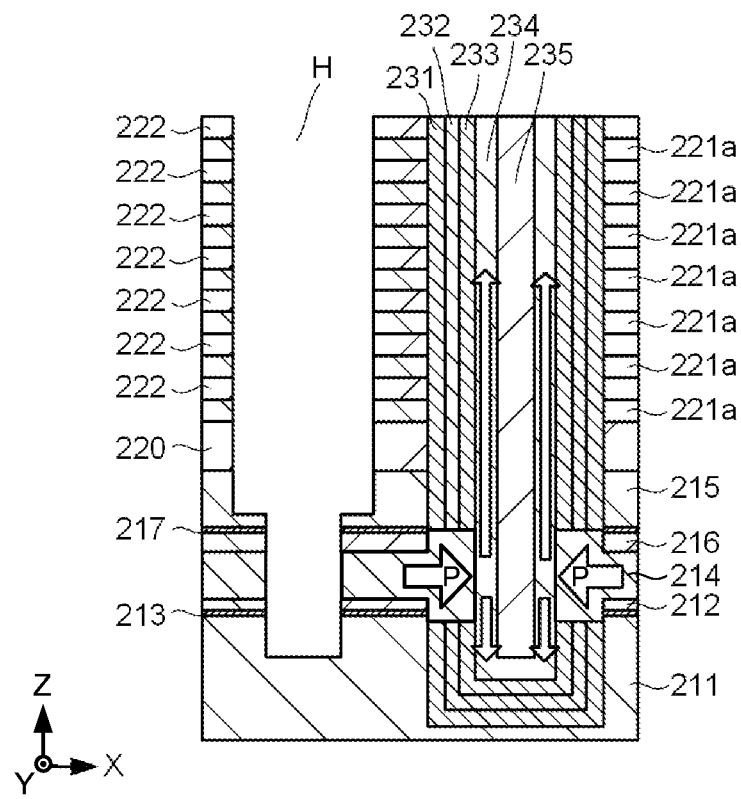
FIG. 16 is a schematic view for explaining a method example of diffusing phosphorus in a semiconductor layer 234.

FIG. 16 is a schematic view for explaining a method example of diffusing phosphorus in the semiconductor layer 234. As illustrated in FIG. 16, the heat treatment diffuses phosphorus in the semiconductor layer 214 into a region of the semiconductor layer 234 overlapping with the select gate line SGSB via a contact portion with the semiconductor layer 234.

The N-type impurity element such as phosphorus is likely to be diffused along a crystal grain boundary of the semiconductor layer 214. For this reason, when the average crystal grain size (the third average crystal grain size) of the semiconductor layer 214 is large, a variation in diffusion of the impurity element sometimes occurs in memory pillars MP.

Figure 17:
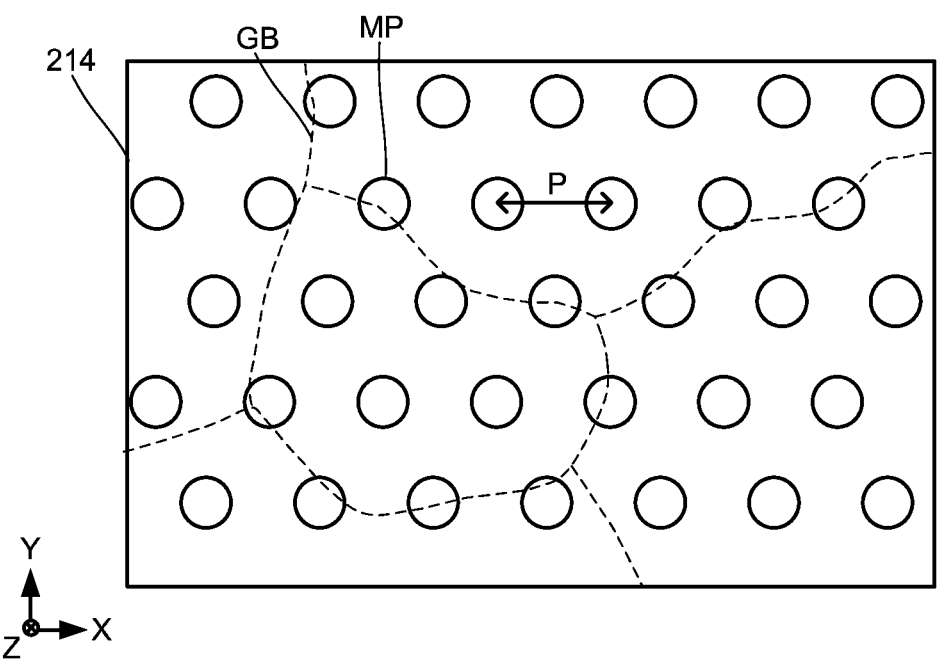
FIG. 17 is a schematic view illustrating an overlapped portion between a semiconductor layer 214 and memory pillars MP in an X-Y plane.

FIG. 17 is a schematic view illustrating an overlapped portion between the semiconductor layer 214 and the memory pillars MP in the X-Y plane. FIG. 17 illustrates the memory pillars MP and a crystal grain boundary GB of the semiconductor layer 214.

As illustrated in FIG. 17, the semiconductor layer 214 overlaps with the memory pillars MP in the X-Y plane. The memory pillars MP are arranged at a predetermined pitch P. The pitch P is a distance between centers of adjacent memory pillars MP in the X-Y plane. When the average crystal grain size of the semiconductor layer 214 is large, this large size forms the memory pillar MP which overlaps with the crystal grain boundary GB and the memory pillar MP which does not overlap with the crystal grain boundary GB in the X-Y plane, resulting in forming the variation in diffusion of the impurity element between these memory pillars MP. This leads to a variation in an amount of holes generated by the GIDL, and reduces the reliability of the semiconductor memory device.

In contrast, The semiconductor memory device of the present embodiment can prevent the increase in the average crystal grain size of the semiconductor layer 214 to increase the number of memory pillars MP which overlap with the crystal grain boundary GB. This can prevent the variation in diffusion of the impurity element between the memory pillars MP to provide the semiconductor memory device with high reliability. In order to increase the number of memory pillars MP which overlap with the crystal grain boundary GB, the average crystal grain size of the semiconductor layer 214 is preferably smaller than the pitch P of the memory pillars MP.

While certain embodiments of the present invention have been described above, these embodiments have been presented by way of example only, and are not intended to limit the scope of the invention. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a source line;
a stack provided above the source line and having conductive layers and insulation layers, the conductive layers and the insulation layers being alternately stacked and extending in a first direction; and
a pillar provided through the stack in a second direction intersecting the first direction,
wherein:
the source line includes:
a first polycrystalline semiconductor layer having a first average crystal grain size,
a second polycrystalline semiconductor layer having a second average crystal grain size smaller than the first average crystal grain size,
a first intermediate layer provided between the first and second polycrystalline semiconductor layers,
a third polycrystalline semiconductor layer having a third average crystal grain size,
a fourth polycrystalline semiconductor layer having a fourth average crystal grain size,
a fifth polycrystalline semiconductor layer having a fifth average crystal grain size smaller than the fourth average crystal grain size, and
a second intermediate layer provided between the fourth and fifth polycrystalline semiconductor layers,
the pillar includes:
a semiconductor layer provided through the stack in the second direction, and provided on the third polycrystalline semiconductor layer, and
a charge storage layer provided between the semiconductor layer and at least one of the conductive layers in the first direction,
the third polycrystalline semiconductor layer is provided between the second and fifth polycrystalline semiconductor layers, and is provided on the second and fifth polycrystalline semiconductor layers, and
the third average crystal grain size is smaller than the first average crystal grain size, and is smaller than the fourth average crystal grain size.

2. The device according to claim 1, wherein:
the second polycrystalline semiconductor layer is thinner than the first polycrystalline semiconductor layer; and
the fifth polycrystalline semiconductor layer is thinner than the fourth polycrystalline semiconductor layer.

3. The device according to claim 1, wherein:
the first intermediate layer is thinner than the second polycrystalline semiconductor layer; and
the second intermediate layer is thinner than the fifth polycrystalline semiconductor layer.

4. The device according to claim 1, wherein each of the first and second intermediate layers contains oxygen, carbon, or nitrogen.

* * * * *